(12) United States Patent
Mathieu et al.

(10) Patent No.: US 7,737,709 B2
(45) Date of Patent: Jun. 15, 2010

(54) METHODS FOR PLANARIZING A SEMICONDUCTOR CONTACTOR

(75) Inventors: Gaetan L. Mathieu, Livermore, CA (US); Benjamin N. Eldridge, Danville, CA (US); Gary W. Grube, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/846,012

(22) Filed: Aug. 28, 2007

(65) Prior Publication Data

US 2008/0048688 A1 Feb. 28, 2008

Related U.S. Application Data

(63) Continuation of application No. 10/852,370, filed on May 24, 2004, now Pat. No. 7,262,611, which is a continuation of application No. 09/527,931, filed on Mar. 17, 2000.

(51) Int. Cl.
   *G01R 31/02* (2006.01)
(52) U.S. Cl. .................................................. 324/754
(58) Field of Classification Search .............. 324/754, 324/758, 764, 765, 158.1; 269/266
   See application file for complete search history.

(56) References Cited

U.S. PATENT DOCUMENTS

| | | | |
|---|---|---|---|
| 3,623,127 A | 11/1971 | Glenn | |
| 3,634,807 A | 1/1972 | Grobe et al. | |
| 3,702,439 A | 11/1972 | McGahey et al. | |
| 3,795,037 A | 3/1974 | Luttmer | |
| 3,806,801 A | 4/1974 | Bove | |
| 3,866,119 A | 2/1975 | Ardezzone et al. | |
| 3,952,410 A | 4/1976 | Garretson et al. | |
| 3,963,986 A | 6/1976 | Morton et al. | |
| 3,998,377 A | 12/1976 | Metz | |
| 4,038,599 A | 7/1977 | Bove et al. | |
| 4,116,523 A | 9/1978 | Coberly et al. | |
| 4,161,692 A | 7/1979 | Tarzwell | |
| 4,177,554 A | 12/1979 | Deveres et al. | |
| 4,312,117 A | 1/1982 | Robillard et al. | |
| 4,423,376 A | 12/1983 | Byrnes et al. | |
| 4,506,215 A | 3/1985 | Coughlin | |

(Continued)

FOREIGN PATENT DOCUMENTS

DE        19952943        7/2003

(Continued)

OTHER PUBLICATIONS

U.S. Appl. No. 09/527,931, filed Mar. 17, 2000, Mathieu et al.

(Continued)

*Primary Examiner*—Ha Tran T Nguyen
*Assistant Examiner*—Arleen M Vazquez
(74) *Attorney, Agent, or Firm*—N. Kenneth Burraston (57) ABSTRACT

A planarizer for a probe card assembly. A planarizer includes a first control member extending from a substrate in a probe card assembly. The first control member extends through at least one substrate in the probe card assembly and is accessible from an exposed side of an exterior substrate in the probe card assembly. Actuating the first control member causes a deflection of the substrate connected to the first control member.

20 Claims, 6 Drawing Sheets

U.S. PATENT DOCUMENTS

| | | | |
|---|---|---|---|
| 4,518,914 A | 5/1985 | Okubo et al. | |
| 4,523,133 A | 6/1985 | Messenger | |
| 4,536,470 A | 8/1985 | Amendola et al. | |
| 4,567,433 A | 1/1986 | Ohkubo et al. | |
| 4,599,559 A | 7/1986 | Evans | |
| 4,622,514 A | 11/1986 | Lewis | |
| 4,623,839 A | 11/1986 | Garretson et al. | |
| 4,636,722 A | 1/1987 | Ardezzone | |
| 4,650,545 A | 3/1987 | Laakso et al. | |
| 4,665,360 A | 5/1987 | Phillips | |
| 4,734,046 A | 3/1988 | McAllister | |
| 4,751,457 A | 6/1988 | Veenendaal | |
| 4,757,256 A | 7/1988 | Whann et al. | |
| 4,758,785 A | 7/1988 | Rath | |
| 4,784,972 A | 11/1988 | Hatada | |
| 4,793,814 A | 12/1988 | Zifcak et al. | |
| 4,833,402 A | 5/1989 | Boegh-Petersen | |
| 4,837,622 A | 6/1989 | Whann et al. | |
| 4,866,507 A | 9/1989 | Jacobs et al. | |
| 4,891,585 A | 1/1990 | Janko et al. | |
| 4,899,099 A | 2/1990 | Mendenhall et al. | |
| 4,906,920 A | 3/1990 | Huff et al. | |
| 4,922,192 A | 5/1990 | Gross et al. | |
| 4,943,719 A | 7/1990 | Akamine et al. | |
| 4,947,481 A | 8/1990 | Ikedo et al. | |
| 4,961,052 A | 10/1990 | Tada et al. | |
| 4,965,865 A | 10/1990 | Trenary | |
| 4,968,589 A | 11/1990 | Perry | |
| 4,969,826 A | 11/1990 | Grabbe | |
| 4,975,638 A | 12/1990 | Evans et al. | |
| 4,998,885 A | 3/1991 | Beaman | |
| 5,055,778 A | 10/1991 | Okubo et al. | |
| 5,059,898 A | 10/1991 | Barsotti et al. | |
| 5,066,358 A | 11/1991 | Quate et al. | |
| 5,070,297 A | 12/1991 | Kwon et al. | |
| 5,079,084 A | 1/1992 | Kondo et al. | |
| 5,094,536 A | 3/1992 | MacDonald et al. | |
| 5,095,616 A | 3/1992 | Veenendaal | |
| 5,103,557 A | 4/1992 | Leedy | |
| 5,120,572 A | 6/1992 | Kumar | |
| 5,148,103 A | 9/1992 | Pasiecznik, Jr. | |
| 5,152,695 A | 10/1992 | Grabbe et al. | |
| 5,157,325 A | 10/1992 | Murphy | |
| 5,166,520 A | 11/1992 | Prater et al. | |
| 5,173,055 A | 12/1992 | Grabbe | |
| 5,180,977 A | 1/1993 | Huff | |
| 5,221,415 A | 6/1993 | Albrecht et al. | |
| 5,225,771 A | 7/1993 | Leedy | |
| 5,228,862 A | 7/1993 | Baumberger et al. | |
| 5,260,926 A | 11/1993 | Kuroda et al. | |
| 5,264,696 A | 11/1993 | Toda | |
| 5,272,913 A | 12/1993 | Toda et al. | |
| 5,321,453 A | 6/1994 | Mori et al. | |
| 5,323,107 A | 6/1994 | D'Souza | |
| 5,355,079 A | 10/1994 | Evans et al. | |
| 5,371,654 A | 12/1994 | Beaman et al. | |
| 5,416,429 A | 5/1995 | McQuade et al. | |
| 5,422,574 A | 6/1995 | Kister | |
| 5,450,290 A | 9/1995 | Boyko et al. | |
| 5,461,326 A | 10/1995 | Woith et al. | |
| 5,476,211 A | 12/1995 | Khandros | |
| 5,476,818 A | 12/1995 | Yanof et al. | |
| 5,480,503 A | 1/1996 | Casey et al. | |
| 5,491,426 A | 2/1996 | Small | |
| 5,513,430 A | 5/1996 | Yanof et al. | |
| 5,517,126 A | 5/1996 | Yamaguchi | |
| 5,517,280 A | 5/1996 | Quate | |
| 5,521,518 A * | 5/1996 | Higgins ............... 324/754 | |
| 5,521,522 A | 5/1996 | Abe et al. | |
| 5,530,371 A | 6/1996 | Perry et al. | |
| 5,534,784 A | 7/1996 | Lum et al. | |
| 5,541,525 A | 7/1996 | Wood et al. | |
| 5,546,012 A | 8/1996 | Perry et al. | |
| 5,563,509 A | 10/1996 | Small | |
| 5,576,630 A | 11/1996 | Fujita | |
| 5,613,861 A | 3/1997 | Smith et al. | |
| 5,635,846 A | 6/1997 | Beaman et al. | |
| 5,639,385 A | 6/1997 | McCormick | |
| 5,642,054 A | 6/1997 | Pasiecznik, Jr. | |
| 5,642,056 A | 6/1997 | Nakajima et al. | |
| 5,649,385 A | 7/1997 | Acevedo | |
| 5,654,647 A | 8/1997 | Uhling et al. | |
| 5,672,977 A | 9/1997 | Yamada | |
| 5,774,340 A | 6/1998 | Chang et al. | |
| 5,786,701 A | 7/1998 | Pedder | |
| 5,801,441 A | 9/1998 | DiStefano et al. | |
| 5,804,983 A | 9/1998 | Nakajima et al. | |
| 5,806,181 A | 9/1998 | Khandros et al. | |
| 5,815,961 A | 10/1998 | Estes et al. | |
| 5,821,763 A | 10/1998 | Beaman et al. | |
| 5,825,192 A | 10/1998 | Hagihara | |
| 5,828,226 A | 10/1998 | Higgins et al. | |
| 5,847,571 A | 12/1998 | Liu et al. | |
| 5,861,759 A | 1/1999 | Bialobrodski et al. | |
| 5,879,568 A | 3/1999 | Urasaki et al. | |
| 5,914,218 A | 6/1999 | Smith et al. | |
| 5,914,533 A | 6/1999 | Frech et al. | |
| 5,917,707 A | 6/1999 | Khandros et al. | |
| 5,937,515 A | 8/1999 | Johnson | |
| 5,952,840 A | 9/1999 | Farnworth et al. | |
| 5,974,662 A | 11/1999 | Eldridge et al. | |
| 5,976,286 A | 11/1999 | Natarajan | |
| 5,989,994 A | 11/1999 | Khoury et al. | |
| 5,990,695 A * | 11/1999 | Daugherty, Jr. ............. 324/758 | |
| 6,000,130 A | 12/1999 | Chang et al. | |
| 6,011,405 A * | 1/2000 | Sikora ................ 324/765 | |
| 6,021,050 A | 2/2000 | Ehman et al. | |
| 6,028,305 A | 2/2000 | Minne et al. | |
| 6,029,966 A * | 2/2000 | Hertz et al. ................ 269/266 | |
| 6,040,700 A | 3/2000 | Berar | |
| 6,043,668 A | 3/2000 | Carney | |
| 6,072,190 A | 6/2000 | Watanabe et al. | |
| 6,078,186 A * | 6/2000 | Hembree et al. ............. 324/755 | |
| 6,087,840 A | 7/2000 | Mizuta | |
| 6,122,823 A | 9/2000 | Kira et al. | |
| 6,140,830 A | 10/2000 | Ott | |
| 6,144,212 A | 11/2000 | Mizuta | |
| 6,160,412 A | 12/2000 | Martel et al. | |
| 6,166,552 A | 12/2000 | O'Connell | |
| 6,189,876 B1 | 2/2001 | Frazier | |
| 6,193,910 B1 | 2/2001 | Ikai et al. | |
| 6,232,791 B1 | 5/2001 | Jitsumori et al. | |
| 6,241,838 B1 | 6/2001 | Sakamoto et al. | |
| 6,255,602 B1 | 7/2001 | Evans et al. | |
| 6,272,020 B1 | 8/2001 | Tosaki et al. | |
| 6,275,051 B1 | 8/2001 | Bachelder et al. | |
| 6,305,230 B1 | 10/2001 | Kasukabe et al. | |
| 6,341,417 B1 | 1/2002 | Gupta et al. | |
| 6,420,884 B1 | 7/2002 | Khoury et al. | |
| 6,499,216 B1 | 12/2002 | Fjelstad | |
| 6,509,751 B1 * | 1/2003 | Mathieu et al. ............. 324/754 | |
| 6,586,956 B2 * | 7/2003 | Aldaz et al. ................ 324/758 | |
| 6,676,784 B2 | 1/2004 | Setzer et al. | |
| 6,706,975 B2 | 3/2004 | Sumi et al. | |
| 6,726,195 B1 * | 4/2004 | Hertz et al. ................ 269/266 | |
| 6,729,019 B2 | 5/2004 | Grube et al. | |
| 6,774,651 B1 | 8/2004 | Hembree | |
| 6,784,678 B2 * | 8/2004 | Pietzschmann ............. 324/758 | |
| 6,799,976 B1 | 10/2004 | Mok et al. | |
| 6,894,888 B2 | 5/2005 | Takeuchi et al. | |
| 6,917,525 B2 | 7/2005 | Mok et al. | |
| 7,098,650 B2 * | 8/2006 | Foster et al. ............. 324/158.1 | |
| 7,102,085 B2 | 9/2006 | Ohta et al. | |
| 7,126,358 B2 | 10/2006 | Mok et al. | |

| | | | |
|---|---|---|---|
| 7,129,723 B2 * | 10/2006 | Bohm | 324/754 |
| 7,129,730 B2 * | 10/2006 | Liu et al. | 324/758 |
| 7,154,284 B2 * | 12/2006 | Fan et al. | 324/754 |
| 7,262,611 B2 | 8/2007 | Mathieu et al. | |
| 7,382,143 B2 * | 6/2008 | Di Stefano | 324/754 |
| 2006/0049820 A1 | 3/2006 | Miller | |
| 2006/0290367 A1 | 12/2006 | Hobbs et al. | |

FOREIGN PATENT DOCUMENTS

| | | |
|---|---|---|
| EP | 0275634 | 7/1988 |
| EP | 0295914 | 12/1988 |
| EP | 0460822 | 12/1991 |
| EP | 0701135 | 3/1996 |
| EP | 8024419 | 10/1997 |
| EP | 0845677 | 11/1997 |
| EP | 1014096 | 6/2000 |
| EP | 1077381 | 2/2001 |
| EP | 1098200 | 5/2001 |
| EP | 0729652 | 10/2002 |
| FR | 2680284 | 2/1993 |
| JP | 57-113243 | 7/1982 |
| JP | 57-193051 | 11/1982 |
| JP | 59149070 | 10/1984 |
| JP | 1152271 | 10/1989 |
| JP | 02-226996 | 9/1990 |
| JP | 2226996 | 9/1990 |
| JP | 3065659 | 9/1990 |
| JP | 03-061339 | 6/1991 |
| JP | 3292406 | 12/1991 |
| JP | 04-207047 | 7/1992 |
| JP | 4207047 | 7/1992 |
| JP | 04-273458 | 9/1992 |
| JP | 04-297876 | 10/1992 |
| JP | 04-297879 | 10/1992 |
| JP | 4294559 | 10/1992 |
| JP | 04-333250 | 11/1992 |
| JP | 05-018741 | 1/1993 |
| JP | 05-015431 | 2/1993 |
| JP | 529406 | 2/1993 |
| JP | 05-102254 | 4/1993 |
| JP | 05-144897 | 6/1993 |
| JP | 05-164785 | 6/1993 |
| JP | 05-211218 | 8/1993 |
| JP | 05-264590 | 10/1993 |
| JP | 05-264591 | 10/1993 |
| JP | 650990 | 2/1994 |
| JP | 06-077295 | 3/1994 |
| JP | 06-267408 | 9/1994 |
| JP | 07-007052 | 1/1995 |
| JP | 07-021968 | 1/1995 |
| JP | 07-063999 | 3/1995 |
| JP | 07-135240 | 5/1995 |
| JP | 07-288271 | 10/1995 |
| JP | 08-083824 | 3/1996 |
| JP | 08-211101 | 8/1996 |
| JP | 09-004278 | 1/1997 |
| JP | 09-138242 | 5/1997 |
| JP | 10-031034 | 2/1998 |
| JP | 10-163278 | 6/1998 |
| JP | 10-260233 | 9/1998 |
| JP | 11-260871 | 9/1999 |
| JP | 2000-124397 | 4/2000 |
| JP | 2002-22767 | 1/2002 |
| JP | 3292406 | 3/2002 |
| KR | 10-0282737 | 11/2000 |
| WO | WO 96/15458 | 5/1996 |
| WO | 98/52218 | 11/1998 |

OTHER PUBLICATIONS

United States District Court, Northern District of California, San Francisco Division, Case No. 3:06-CV-07159 JSW, Defendants' Patent Local Rule 3-3 Preliminary Invalidity Contentions for U.S. Patent Nos. 6,246,247, 6,509,751, 6,624,648, and 7,073,254, Oct. 8, 2007.

United States International Trade Commission, In the Matter of Certain Probe Card Assemblies, Components Thereof and Certain Tested Dram and Nand Flash Memory Devices and Products Containing Same, Inv. No. 337-TA-621, Respondent Micronics Japan Co., Ltd's First Supplemental Response to Complainant FormFactor, Inc's First Set of Interrogatories (Nos. 25-29), Exhibit 5, Mar. 14, 2008.

United States International Trade Commission, In the Matter of Certain Probe Card Assemblies, Components Thereof and Certain Tested DRAM and NAND Flash Memory Devices and Products Containing Same, Investigation No. 337-TA-621, Supplemental Response of Phicom Corporation to Complainant FormFactor, Inc.'s First Set of Interrogatories (Nos. 26-30), Exhibit 29, Mar. 14, 2008.

"Membrane Probe Technology for MCM Known-Good-Die", article, HP Japan, 1994 (MJC1975640-47) Yes.

Matta, "Wafer Level Testing With a Membrane Probe", article, IEEE, 1989 (MJC1975612-19).

R. Miracky et al., "Technologies for Rapid Prototyping of Multi-Chip Modules", Computer Design: VLSI in Computers and Processors-Proceedings, 1991, pp. 588-592.

Kai Zoschke et al., "Stackable Thin Film Multi Layer Substrates with Integrated Passive Components", Electronic Components and Technology Conference-Proceedings, 2006, pp. 806-813.

R. R. Tummala, et al., "High-Performance Glass-Ceramic/Copper Multilayer Substrate with Tine-Film Redistribution", IBM Journal of Research and Development-Proceedings, vol. 36 No. 5, Sep. 1992, pp. 889-904.

Nancy E. Preckshot et al., "Design Methodology of a 1.2 μm Double-Level-Metal CMOS Technology", IEEE Transactions on Electron Devices-Proceedings, vol. 31 No. 2, Feb. 1984, pp. 215-225.

Grace Chan et al., "C4 Probe Card Space Transformer Technology Overview", Intel Southwest Test Workshop-Proceedings, Jun. 12, 2000, pp. 1-24.

A. Fach et al., "Multilayer Film Substrates with 30 μm Vias for MCM Applications", International Conference on Multichip Modules and High Density Packaging-Proceedings, 1998, pp. 337-341.

T. Tada et al., "A Fine Pitch Probe Technology for VLSI Wafer Testing", International Test Conference (ITC)-Proceedings-The Changing Philosophy of Test, 1990, pp. 900-906.

Daniel T. Hamling, "A 3 GHz, 144 Point Probe Fixture for Automatic IC Wafer Testing", International Test Conference (ITC)-Proceedings, 1992, pp. 940-947.

Nicholas Spork, "A New Probe Card Technology Using Compliant Microsprings", International Test Conference (ITC)-Proceedings, 1997, pp. 527-532.

Bruce C. Kim, et al., "A High Throughput Test Methodology for MCM Substrates", International Test Conference (ITC)-Proceedings, 1998, pp. 234-240.

David H. Carey, "Trends in Low-Cost, High-Performance Substrate Technology", Microelectronics & Computer Technology Corp-Proceedings, Apr. 1993, pp. 19-27.

Teradyne, Polaris 384 OHP User Guide, Rev. 2 (MJC1975620-636) May 2, 1996.

C. Narayan et al., "Thin Film Transfer for Low Cost MCM-D Fabrication", Proceedings-SPIE, vol. 2256, International Conference and Exhibition-Multichip Modules, 1994, pp. 105-114.

A.J. Piloto et al., "Integrated Passive Components: A Brief Overview of LTCC Surface Mount and Integral Options", proceedings, Sep. 1, 1999, pp. 1-7.

Karl F. Zimmerman, "SiProbe-A New Technology for Wafer Probing", proceedings, 1995, International Test Conference, pp. 106-112 (MJC1975652-58).

United States International Trade Commission, in the Matter of Certain Probe Card Assemblies, Components Thereof and Certain Tested DRAM and NAND Flash Memory Devices and Products Containing Same, Inv. No. 337-Ta-621, Respondent Micronics Japan Co., Ltd's First Supplemental Response to Complainant FormFactor, Inc's First Set of Interrogatories (Nos. 25-29), Exhibit 5, Mar. 14, 2008.

United States International Trade Commission, in the Matter of Certain Probe Card Assemblies, Components Thereof and Certain Tested DRAM and NAND Flash Memory Devices and Products Containing Same, Investigation No. 337-TA-621, Supplemental Response of Phicom Corporation to Complainant FormFactor, Inc.'s First Set of Interrogatories (Nos. 26-30), Exhibit 29, Mar. 14, 2008. Yes.

"Development of Manufacturing Process Membrane Probe Card", Korean Institute of Machinery and Materials, May 1992.

C. Barsotti et al., "Very High Density Probing", 1988.

In the Matter of Certain Probe Card Assemblies, Components Thereof and Certain Tested DRAM and NAND Flash Memory Devices and Products Containing Same, Investigation No. 337-TA-621, Initial Determination on Violation of Section 337 and Recommended Determination on Remedy and Bond, (Jun. 29, 2009), 214 pages.

In the Matter of Certain Probe Card Assemblies, Components Thereof and Certain Tested DRAM and NAND Flash Memory Devices and Products Containing Same, Investigation No. 337-TA-621, Commission Opinion (Dec. 10, 2009), 20 pages.

* cited by examiner

METHODS FOR PLANARIZING A SEMICONDUCTOR CONTACTOR

BACKGROUND OF THE INVENTION

1. Field of the Invention

The present invention relates generally to a probe card assembly, and more specifically to achieving a more planar relationship between the contact elements on a probe card assembly and a device under test.

2. Background Information

Individual semiconductor devices (dies) are typically produced by creating several identical devices on a semiconductor wafer, using commonly known techniques such as photolithography and deposition. Generally, these processes are intended to create fully functional integrated circuit devices, prior to separating the individual dies from the semiconductor wafer. However, physical defects in the wafer and defects in the processing of the wafer often lead to the presence of some defective dies on the wafer. It is desirable to be able to identify the defective dies prior to packaging or prior to their separation from the wafer. To perform such identification, wafer testers or probers are used to make pressure connections to connection pads (bond pads) on the dies. The dies can then be tested for defects. A conventional component of a wafer tester is a probe card which has contact elements that effect the pressure connections to the bond pads of the dies.

A probe card can be part of a probe card assembly, such as that which is described in U.S. Pat. No. 5,974,662, titled "Method of Planarizing Tips of Probe Elements of a Probe Card Assembly," which is incorporated by reference herein. A probe card assembly according to U.S. Pat. No. 5,974,662 typically includes a number of components in addition to the probe card itself, such as an interposer and a space transformer. The interposer is disposed between the probe card and the space transformer and allows the orientation of the space transformer to be adjusted relative to the orientation of the probe card.

The space transformer permits a plurality of contact structures on one side of the space transformer to make contact with the terminals of an electronic component (e.g. bond pads on a semiconductor device) at a relatively fine pitch, while connections to another side of the space transformer are made at a relatively coarser pitch. In a preferred embodiment, the contact structures make contact with an active semiconductor device, such as a wafer. Such connections can be disrupted by slight variations in the planarity of the space transformer. Unfortunately, variations in the planarity of the space transformer can occur, for example, when the space transformer is manufactured. For example, an edge of the space transformer might be bent slightly or the center of the space transformer might be bowed.

Figure 1:
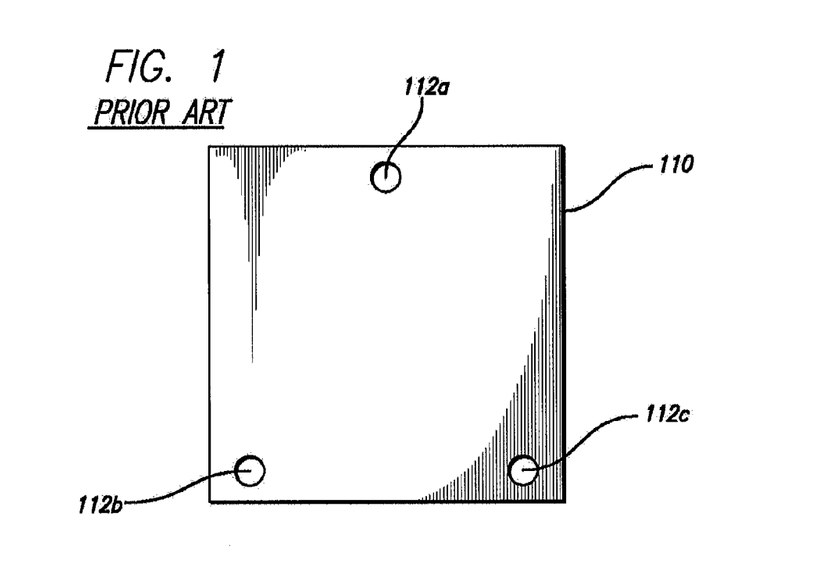
FIG. 1 illustrates generally a prior art technique for adjusting the planarity of a space transformer in a probe card assembly.

FIG. 1 illustrates generally a prior art technique for adjusting the orientation of a space transformer. A space transformer 110 is shown with different sets of adjustment points on the bottom of space transformer 110. In one example, the adjustment points correspond to the locations of ball bearings that can be pressed against a back surface of space transformer 110 to adjust the orientation of space transformer 110. In FIG. 1, three adjustment points 112a-112c are used to adjust the orientation of space transformer 110. Adjustment points 112a-112c are located along the periphery of space transformer 110.

The adjustment points shown in FIG. 1 can be used to deflect peripheral areas of space transformer 110, but they cannot be used to deflect non-peripheral areas, such as the center, of space transformer 110. The three points of adjustment shown in FIG. 1 define a plane which is approximately parallel to the plane of a front surface of space transformer 110. However, because there are only three adjustment points, they can adjust the orientation, but not the shape, of space transformer 110; geometric changes are made on only a low order ($1^{st}$ order polynomial). Furthermore, using ball bearings in conjunction with the adjustment points provides for the application of only a pushing force against space transformer 110, and in some instances, the pushing force is opposed by a spring member on an opposite side of space transformer 110.

In many instances, it is desirable to be able to apply a pulling or pushing force at a multiplicity of locations on a space transformer because the space transformer may require deflection or distortion over its surface to achieve better planarity and correct surface variations.

SUMMARY OF THE INVENTION

The present invention provides, in one embodiment, a method of adjusting the planarity of a substrate in a probe card assembly, in which the method includes deflecting at least one of a first area of the substrate, a second area of the substrate, a third area of the substrate, and a fourth area of the substrate, and the deflecting includes applying a pulling force to at least one of the first, second, third and fourth areas of the substrate.

The present invention provides, in another embodiment, a method of achieving a degree of planarity among contact portions of a plurality of contact structures mounted to a substrate, in which the method includes creating the substrate with the plurality of contact structures connected to a first surface of the substrate, the contact portions of the contact structures having a first planar relationship relative to one another, and applying a plurality of forces selectively to the substrate to deform the substrate and achieve a second planar relationship of the contact portions of the contact structures relative to one another.

Additional features and benefits of the present invention will become apparent upon review of the following description.

BRIEF DESCRIPTION OF THE DRAWINGS

Various embodiments of the present invention will be described in detail with reference to the following drawings in which like reference numerals refer to like elements. The present invention is illustrated by way of example and not limitation in the accompanying figures. It should be noted that many of the features shown in the figures have not been drawn to scale for the purpose of better illustrating such features.

DETAILED DESCRIPTION

The following description provides embodiments of the present invention. However, it will be appreciated that other embodiments of the present invention will become apparent to those of ordinary skill in the art upon examination of this description. Thus, the present description and accompanying drawings are for purposes of illustration and are not to be used to construe the invention in a restrictive manner.

In a preferred embodiment of the present invention, a probe card assembly includes a probe card, an interposer, a space transformer, a drive plate and a first control member. The interposer is located between the probe card and the space transformer. The drive plate is located adjacent to the probe card. A protrusion extends from a central area of the bottom surface of the space transformer and through a through hole in the interposer. The first control member is coupled to the protrusion and is disposed within the through hole in the interposer and through holes in the probe card and drive plate. The first control member has an actuating component rotatably coupled to an end of the first control member that is accessible from an exposed side of the drive plate. A spring is supported by the actuating component to be urged against the drive plate. As the actuating component is rotated and moved toward the drive plate, the spring is pressed against the drive plate and provides a resistance to the movement of the actuating component. During this time, the space transformer is pulled toward the interposer via the first control member coupled to the protrusion extending from the space transformer. Thus, a non-peripheral area of the space transformer is deflected according to a preferred embodiment of the present invention.

Figure 2:
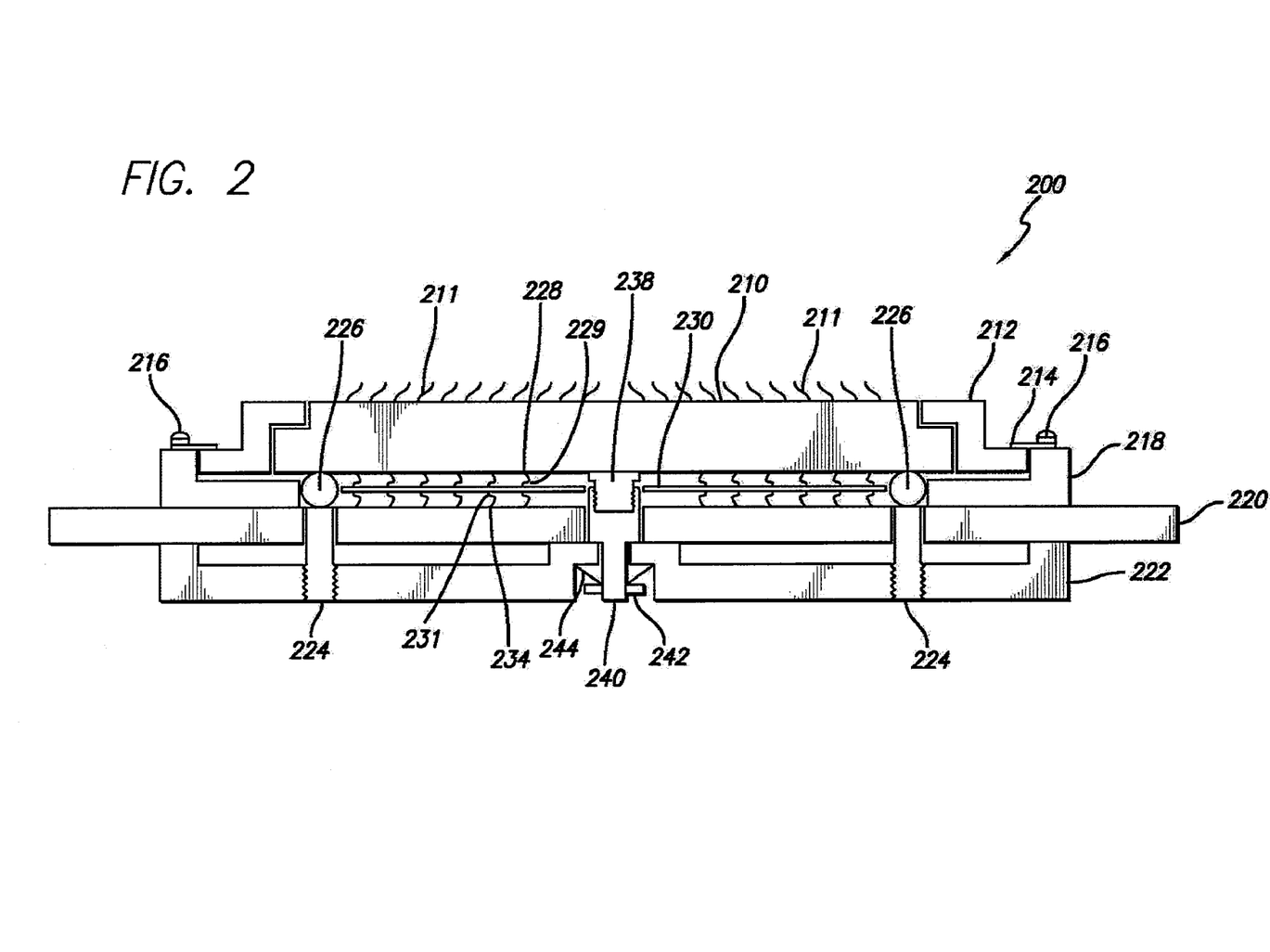
FIG. 2 illustrates a cross-sectional view of a probe card assembly in accordance with the teachings of the present invention.

FIG. 2 illustrates a side cross-sectional view of a probe card assembly 200 in accordance with the teachings of the present invention. A space transformer 210 is held down at its periphery by a clamping frame 212. The top of space transformer 210 may be substantially flush with the top of frame 212 such that a plurality of resilient contact structures 211 extending from the top of space transformer 210 can extend above the top surface of frame 212.

Contact structures 211 each have a contact region for making contact with the terminals of an electronic component (e.g. bond pads on a semiconductor device). In one embodiment, contact structures 211 are free-standing, springable contact elements. It is appreciated that other contact elements can be used in place of contact structures 211. It is preferred that such elements are sufficiently coupled to space transformer 210 to benefit from the planarizing action associated with the present invention. For example, posts, pins, pads, terminals and bumps/balls or other contact elements known in the art can be used as contact elements.

A clamping spring 214 (e.g. leaf spring) is coupled to a frame 218 by screws 216. Spring 214 secures frame 212. A printed wiring board 220, such as probe card, is located beneath frame 218 and has a through hole in its center and through holes at points around the center in a regular pattern. A drive plate 222, which can also act as a stiffening substrate, is coupled to the bottom of board 220. Drive plate 222 has a set of through holes which align with the through holes in board 220. Screws 224 are placed in the outer through holes in both board 220 and drive plate 222. Ball bearings 226 rest on an end of screws 224 and are pressed against space transformer 210 when screws 224 are screwed toward space transformer 210.

An interposer 230 is located between space transformer 210 and board 220. Interposer 230 has a central through hole. Resilient contact structures 229 extend from the top of interposer 230 and effect pressure connections with contact pads 228 located on space transformer 210. Resilient contact structures 231 extend from the bottom of interposer 230 and effect pressure connections with contact terminals 234 located on board 220. A threaded protrusion or stud 238 extends from the bottom of space transformer 210. Stud 238 may be coupled to space transformer 210 or integrally formed with space transformer 210. An extension stud 240 has a threaded bore in one end which is screwed onto stud 238. The other end of stud 240 is threaded and accommodates an actuating nut 242. Stud 240 is disposed through the central through holes of interposer 230, board 220 and drive plate 222. A spring element 244 (e.g. Belleville washer) is supported by nut 242 and is pressed against drive plate 222 as nut 242 is moved up stud 240.

It is appreciated that a plurality of resilient contact structures can be provided on the bottom surface of a space transformer (e.g. fabricated on the terminals on the bottom surface of a space transformer) to make direct contact to the terminals on the top surface of a printed wiring board. Thus, the use of an interposer is optional. One alternative to an interposer is a semi-rigid support member that backs a flexible sheet incorporating contact structures. The semi-rigid support member, and hence the flexible sheet and contact structures, can be planarized in accordance with the teachings of the present invention. Other alternatives to an interposer include flex tape, pogo pins and other socket or interconnect constructions.

More detailed discussions of printed wiring boards (e.g. probe cards), interposers, space transformers, drive plates, resilient contact structures, contact elements and other components of a probe card assembly that can be used in conjunction with the present invention can be found in U.S. Pat. No. 5,974,662, U.S. patent application Ser. No. 08/920,255, titled "Making Discrete Power Connections to a Space Transformer of a Probe Card Assembly," now U.S. Pat. No. 6,050,829, and U.S. patent application Ser. No. 09/042,606, titled "Probe Card Assembly and Kit," now U.S. Pat. No. 7,064,566, all of which are incorporated by reference herein.

The planarity of space transformer 210 can be adjusted via peripheral control members (e.g. screws 224 and ball bearings 226) and a non-peripheral control member (e.g. stud 240 coupled to stud 238).

For example, screws 224 can be accesses from the bottom side of drive plate 222 to drive them upward and force ball bearings 226 against space transformer 210. Because space transformer 210 is held by frame 212 and spring 214, the contact of ball bearings 226 against space transformer 210 subjects space transformer 210 to compressive forces. Thus, when ball bearings 226 are pressed against space transformer 210, space transformer 210 deflects accordingly. Because ball bearings 226 are located near the periphery of space transformer 210, only peripheral areas of space transformer 210 are adjustable via screws 224 and ball bearings 226. Furthermore, because screws 224 are accessible from an exposed side of drive plate 222, the planarity of peripheral areas of space transformer 210 is remotely adjustable. It should be noted that screws 224 and ball bearings 226 can be used to deflect space transformer 210 without interfering with interposer 230.

A central area of space transformer 210 can be deflected through the actuation of nut 242. As nut 242 is turned and moves up extension stud 240, spring element 244 is pressed against drive plate 222 by nut 242. Spring element 244 provides a resistance to the upward movement of nut 242. Thus, as nut 242 is turned around the threads of stud 240 and urged against spring element 244, stud 240 is pulled down. Because stud 240 is coupled to stud 238, the area of space transformer 210 where stud 238 is located is also pulled down along with stud 240. Thus, such area of space transformer 210 is subjected to a pulling force or tensile force. If space transformer 210 is bowed (e.g. domed), then stud 240 can be pulled down through the actuation of nut 242 to adjust the planarity of space transformer 210. It should be noted that because nut 242 is accessible from an exposed side of drive plate 222, the planarity of a non-peripheral area of space transformer 210 is remotely adjustable. It should be further noted that studs 238 and 240 can be used to deflect space transformer 210 without interfering with interposer 230.

Stud 238 can be located at a variety of positions on the bottom surface of space transformer 210. For example, stud 238 can be located near the center or the edge of the bottom surface of space transformer 210. Thus, it is appreciated that the planarizing apparatus of the present invention can be used to deflect peripheral areas, as well as non-peripheral areas, of a substrate in a probe card assembly. Furthermore, multiple studs can be used. A space transformer can be configured to use a system in which as many as all of the studs or other elements fixed to the space transformer provide pushing and pulling forces through an actuating mechanism to effect the desired deformation of a surface of the space transformer.

Screws 224 and ball bearings 226 cannot be used to pull down a central area of space transformer 210 because they are configured to function with an opposing spring against space transformer 210. The planarizing apparatus of the present invention addresses such a deficiency as described above. Thus, the planarity of space transformer 210 can be more thoroughly adjusted, particularly on a higher order of adjustment (e.g. $2^{nd}$ order polynomial, $3^{rd}$ order polynomial, etc.), with the planarizing apparatus of the present invention.

In addition to being able to adjust the planarity of space transformer 210, the planarizing apparatus of the present invention can be used to deflect space transformer 210 such that the contact regions of contact structures 211 are planarized relative to one another. The planarization of the contact regions of contact structures 211 allows more uniform contact to be made with the terminals of an electronic component to facilitate testing of the electronic component. Furthermore, the deflection of space transformer 210 can effect more uniform contact between contact pads 228 and contact structures 229, and between terminals 234 and contact structures 231.

Figure 3A:
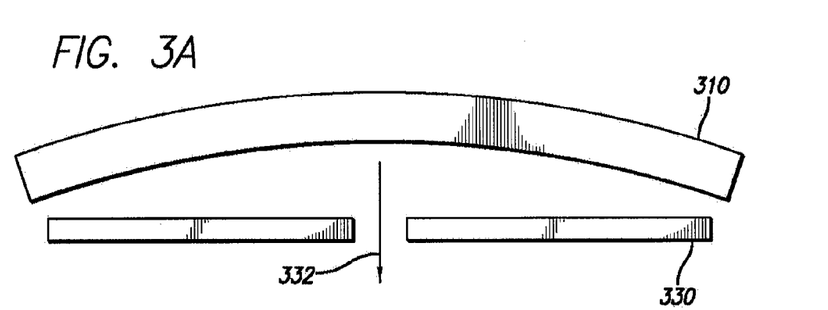
FIGS. 3A and 3B illustrate generally deflections of a substrate in a probe card assembly in accordance with the teachings of the present invention.
Figure 3B:
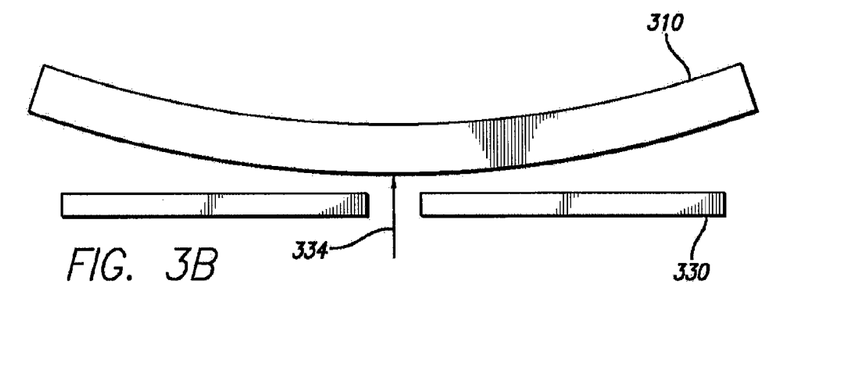

FIGS. 3A and 3B illustrate generally a bowed substrate 310, such as a space transformer, which is typically located in a probe card assembly. If substrate 310 is bowed as shown in FIG. 3A, then a force 332 (e.g. tensile force) which does not directly affect an adjacent interposer 330 can be applied to substrate 310 to pull substrate 310 into a desired position. Specifically, a central area of substrate 310 can be deflected to a desired planarity. Such a pulling force can be applied as previously described in conjunction with FIG. 2. If substrate 310 is bowed as shown in FIG. 3B, then a force 334 (e.g. compressive force) which does not affect interposer 330 can be applied to substrate 310 to push substrate 310 into a desired position. Specifically, a central area of substrate 310 can be deflected to a desired planarity. Such a pushing force can be applied using an embodiment of the present invention as shown in FIG. 5C.

Figure 4A:
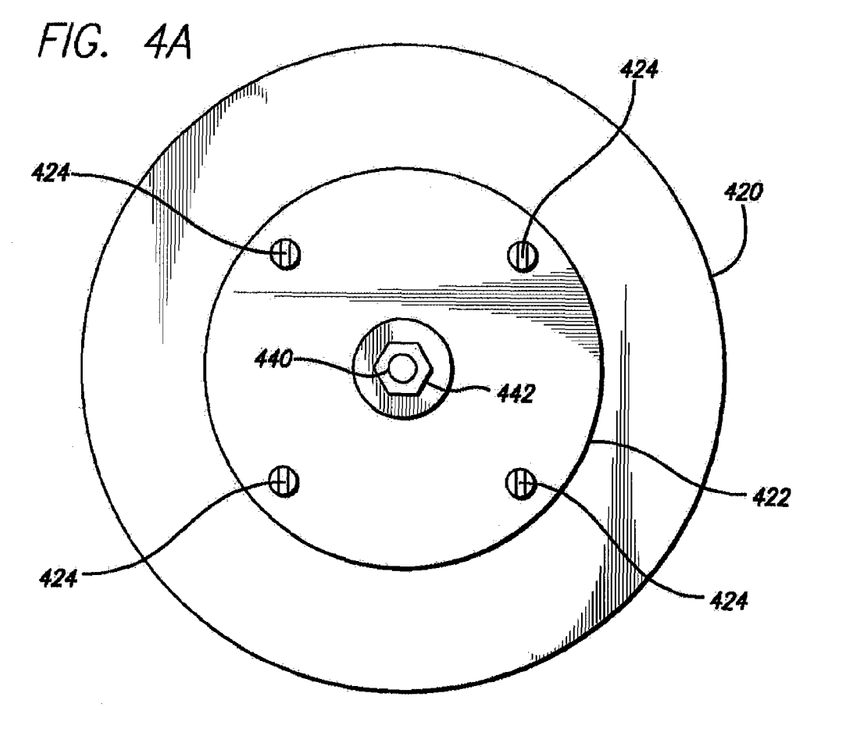
FIG. 4A illustrates a bottom view of a probe card assembly in accordance with the teachings of the present invention.
Figure 4B:
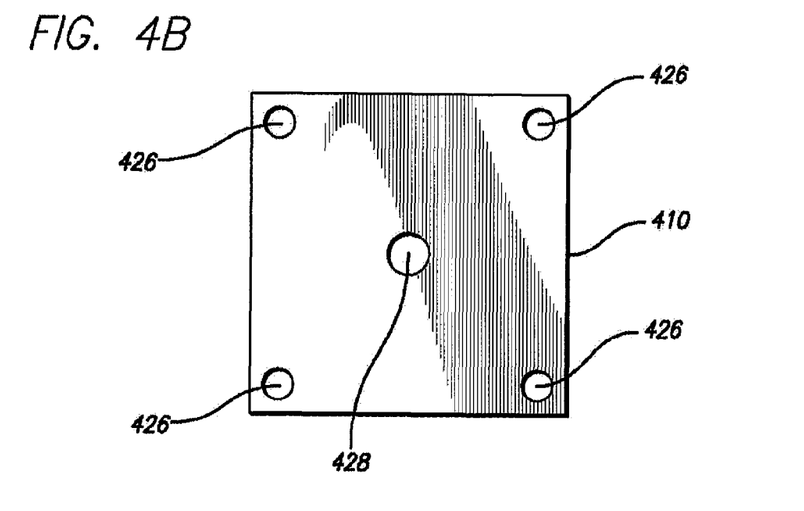
FIG. 4B illustrates a bottom view of a substrate in the probe card assembly shown in FIG. 4A.

FIG. 4A illustrates a bottom view of a probe card assembly fitted with push-only control members 424, which are similar to screws 224, and a push-pull control member 440, which is similar to extension stud 240. A drive plate 422 is coupled to a probe card 420. Both drive plate 422 and probe card 420 have through holes to accommodate control members 424 and 440. Control members 424 drive ball bearings 426 at corresponding locations of a substrate 410, as shown in FIG. 4B. Substrate 410, such as a space transformer, is typically part of a probe card assembly such as that shown in FIG. 2. A stud 428 extending from the surface of substrate 410 is coupled to central control member 440 to allow a central area of substrate 410 to be deflected by the actuation of a nut 442 relative to control member 440. Control members 424 and 440 can be driven independently to adjust the planarity of substrate 410 in a variety of ways.

Figure 5A:
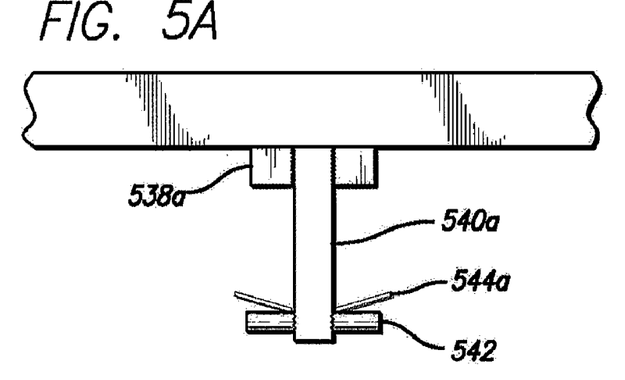
FIGS. 5A-5C illustrate different embodiments of a planarizing element for a probe card assembly in accordance with the teachings of the present invention.
Figure 5B:
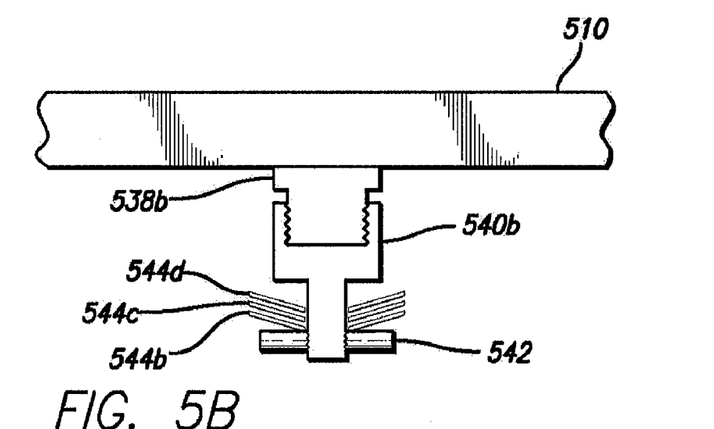
Figure 5C:
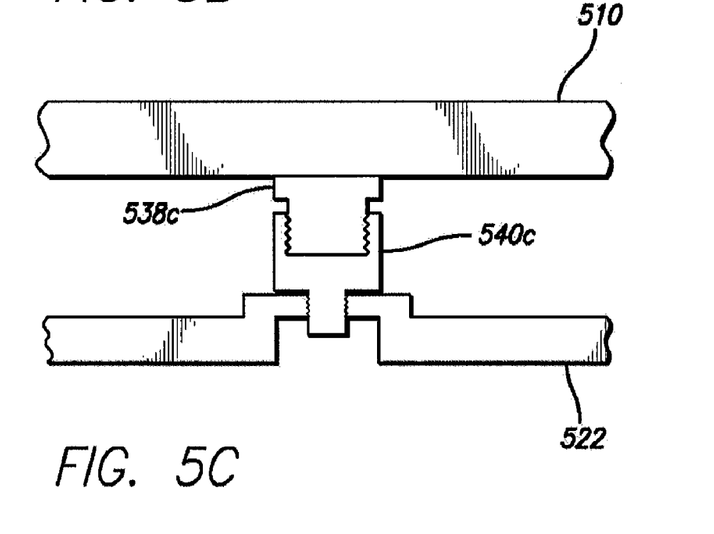

FIGS. 5A-5C illustrate various embodiments of a planarizing apparatus according to the present invention. In FIG. 5A, a substrate 510, such as a space transformer, has a stud 538a coupled to or integrally formed with the bottom surface of substrate 510. Stud 538a has a threaded bore to accommodate a connector 540a having threaded ends. A nut 542 coupled to one of the threaded ends of connector 540a supports a spring element 544a, which can be pressed against a substrate (not shown), such as a drive plate, in a manner similar to that described in conjunction with FIG. 2. The actuation of nut 542 relative to connector 540a and the resulting resistance provided by spring element 544a help drive connector 540a down, thereby deflecting substrate 510. Spring element 544a is shown as a Belleville washer. It is appreciated that other springs elements, such as coil springs and wavy washers could be used in lieu of a Belleville washer. Furthermore, the spring element could be built into the bottom of the drive plate.

In FIG. 5B, substrate 510 has a threaded stud 538b coupled to or integrally formed with the bottom surface of substrate 510. A connector 540b with a threaded bore is coupled to stud 538b. A nut 542 coupled to a threaded end of connector 540b supports spring elements 544b-544d against a substrate (not shown), such as a drive plate. Different spring elements can be used as spring elements 544b-544d to provide varying resistances to nut 542 as nut 542 is twisted along the threads of connector 540b toward space transformer 510.

In FIG. 5C, substrate 510 has a threaded stud 538c coupled to or integrally formed with the bottom surface of substrate 510. A connector 540c with a threaded bore is coupled to stud 538c. A threaded end of connector 540c is coupled to a threaded through hole in a substrate 522, such as drive plate. Connector 540c is accessible from an exposed side of substrate 522, which is typically an exterior substrate of a probe card assembly. Connector 540c can be turned clockwise or counter-clockwise to deflect substrate 510 in opposite directions.

It should be noted that a multipoint adjustment scheme according to the present invention can also be used to modify the orientation (e.g. in x, y and θ directions) of a substrate in a probe card assembly with respect to other substrates in the assembly without interfering with the planarity or orientation of such other substrates. Accordingly, a probe card assembly having multiple deformable substrates may be constructed and made planar across the surface defined by their contact elements with respect to a test substrate, while appropriate positions of the contact elements from substrate to substrate are maintained. Such an assembly is shown generally in FIG. 6.

Figure 6:
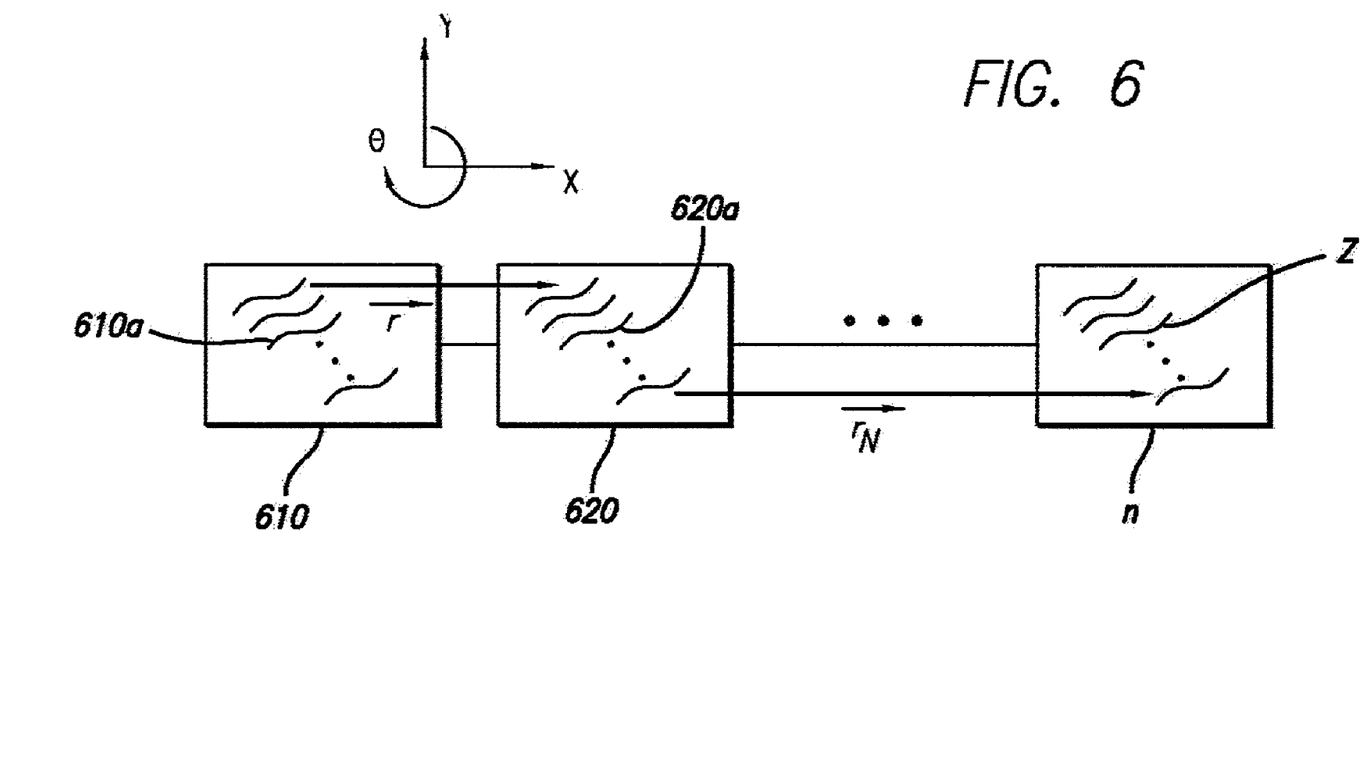
FIG. 6 illustrates multiple adjustable substrates of a probe card assembly.

Multiple substrates 610, 620 . . . n are located adjacent to one another in a combined assembly. Each substrate is adjustable with respect to the other substrates in x, y and θ using orienting mechanisms (not shown) well known in the art. A system for deforming substrates in the z direction (out of the page) is also included but is not shown. Such a system may incorporate planarizing elements as disclosed herein. The vector r defines the relationship between corresponding contact elements 610a, 620a . . . z on multiple substrates 610, 620 . . . n, respectively. Substrates 610, 620 . . . n are positioned with respect to one another such that r is within a desired degree of accuracy, and deformed such that the contact tips of contact elements 610a, 620a . . . z are coplanar within a desired degree of accuracy in the z direction.

Figure 7A:
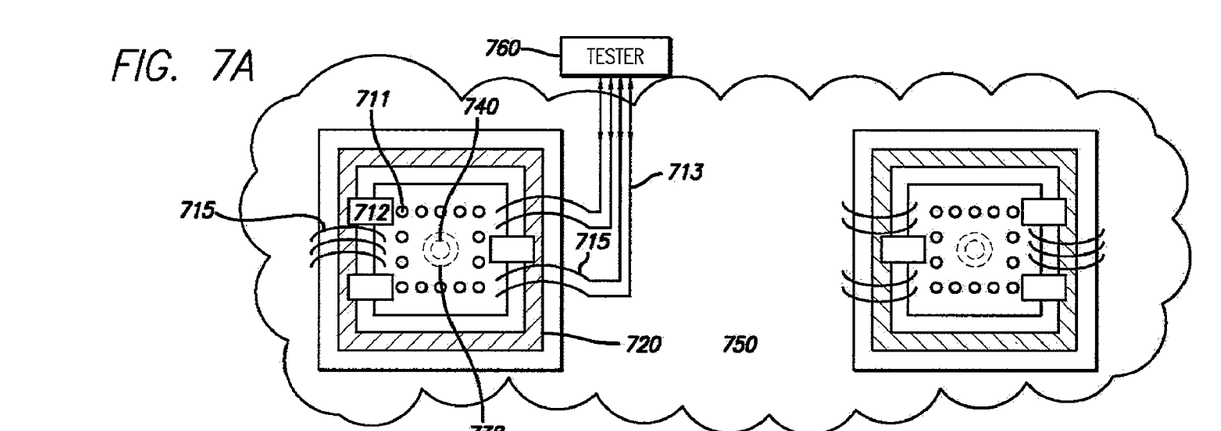
FIG. 7A illustrates a top view of a multiple substrate assembly in accordance with the teachings of the present invention.
Figure 7B:
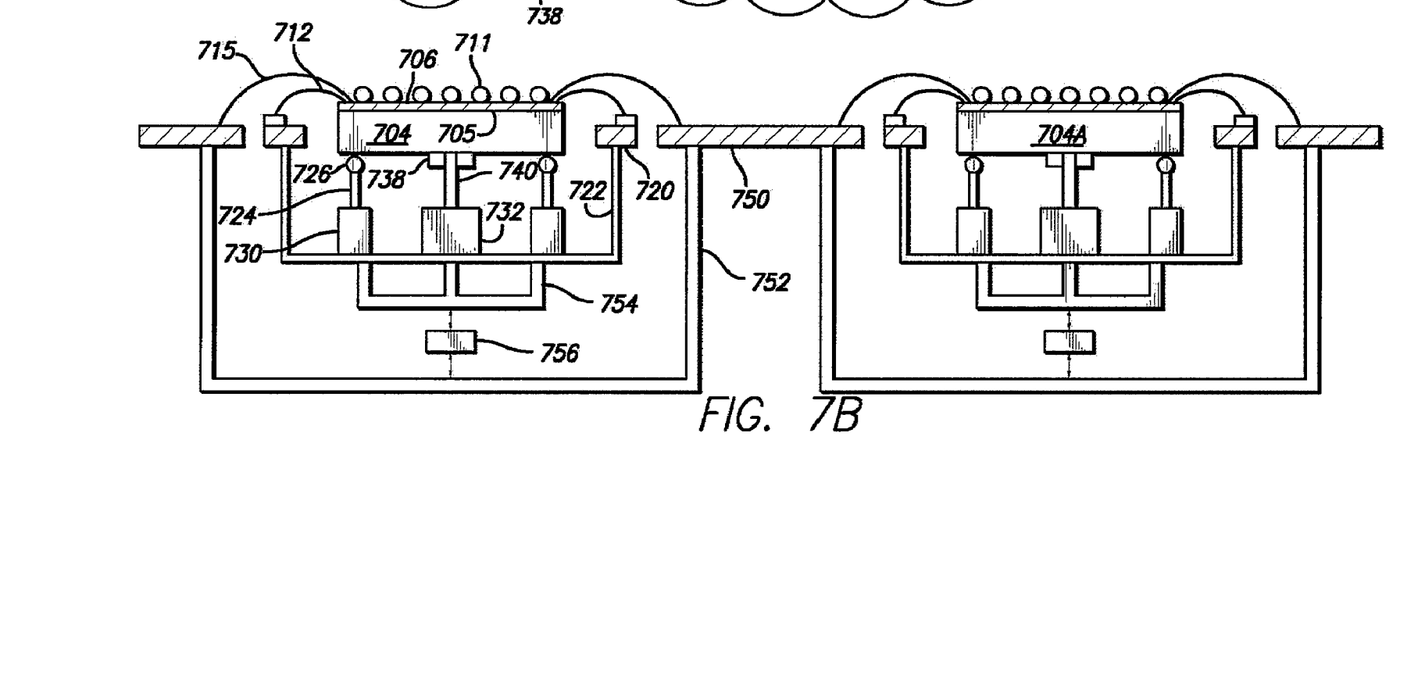
FIG. 7B illustrates a side view of the multiple substrate assembly shown in FIG. 7A.

Referring to FIGS. 7A and 7B, which provide more detailed representations of a combined assembly having multiple substrates similar to that shown in FIG. 6, contact elements 711 are secured to insulating support member 705. Contact elements 711 are electrically connected by traces 706 to connecting wires 715, which are connected in turn to traces 713 and to tester 760. Contact elements 711 are illustrated as solder balls but of course can take many of the forms described herein. In one preferred embodiment, connecting wires 715 are portions of a multi-stranded flex cable. In another preferred embodiment, connecting wires 715 can be wirebonded connections. In still another preferred embodiment, insulating support member 705 is polyimide, or other flex materials well known in the art.

Substrate 704 supports insulating support member 705. In one preferred embodiment, they are secured together. In another preferred embodiment, they can be in close contact, but can move relative to each other. Substrate 704 is positioned by a push-only control element comprising actuator 730 acting on element 724 and ball 726 to press against substrate 704, opposed by spring 712, which in turn is secured to substrate frame 720. Several of these push control elements can be used; two are shown in FIG. 7B for illustrative purposes. Substrate 704 also is positioned by a push-pull control element comprising actuator 732, element 740, and stud 738, which is secured to substrate 704. Substrate frame 720 is secured to substrate housing 722, which in turn is connected to actuators 730, 732, forming a closed loop system. By selectively positioning the actuators, the shape of substrate 704 can be controlled.

Printed wiring board 750 supports housing 752, which is connected to positioning element 756, which in turn is connected to substrate housing 722 directly or, as shown, through bridge housing 754. Positioning element 756 is illustrated in stylized form and can include elements as desired to provide x, y, z, and three degrees of positional control over substrate housing 722.

FIG. 7B illustrates a second substrate 704a as well, with elements as described above. Each substrate 704, 704a can be adjusted to a desired degree of planarity. Equally well, each substrate 704, 704a can be adjusted to a desired degree of flatness of the contact region portion of each of contact elements 711. Moreover, substrates 704 and 704A can be positioned relative to each other to provide a relatively large array of contact elements 711.

Such a probe card assembly constructed of multiple deformable substrates is functionally equivalent to a larger probe card assembly having a much larger (equivalent in area) single substrate. It is important to note that deformation of the monolithic substrate in order to change the spatial relationship of the contact elements residing on it is achieved both by deformation and x, y, z, and θ movement of the multiple substrates and supporting structures in which they reside.

The planarizing apparatus of the present invention can be manually actuated or automatically actuated. For example, an actuator mechanism can be connected to a planarizing apparatus (e.g. to the actuating nut) and operated according to signals from a computer system. A greater number of control points driven by such automated planarizing apparatuses can shape a substrate to a higher degree of accuracy.

Although the present invention has been described with particular reference to probe card assemblies and space transformers in particular, it is appreciated that the present invention is not so limited in its applications.

In the foregoing detailed description, the apparatus and method of the present invention have been described with reference to specific exemplary embodiments. However, it will be evident that various modifications and changes may be made without departing from the broader scope and spirit of the present invention. The present specification and figures are accordingly to be regarded as illustrative rather than restrictive.

What is claimed is:

1. A method of changing shapes of surfaces of a plurality of substrates of a probe card assembly, wherein an array of contact elements is disposed on each of the surfaces, the method comprising:

activating a first deforming mechanism coupled to a first of the substrates and thereby deforming the surface of the first substrate and planarizing tips of the array of contact elements disposed on the surface of the first substrate; and activating a second deforming mechanism coupled to a second of the substrates and thereby deforming the surface of the second substrate and planarizing tips of the array of contact elements disposed on the surface of the second substrate with the tips of the array of contact elements disposed on the surface of the first substrate, wherein the surface of the first substrate remains deformed until the first deforming mechanism is again activated and the surface of the second substrate remains deformed until the second deforming mechanism is again activated.

2. The method of claim 1, wherein:

the first deforming mechanism maintains the surface of the first substrate deformed except while the first deforming mechanism is being activated; and the second deforming mechanism maintains the surface of the second substrate deformed except while the second deforming mechanism is being activated.

3. The method of claim 1, wherein:

the first substrate comprises a ceramic wiring substrate; and the second substrate comprises a ceramic wiring substrate.

4. The method of claim 1, wherein the probe card assembly comprises:

a wiring substrate comprising an interface connectable to a tester for controlling testing of semiconductor dies in a test system;

the tips of the contact elements are configured to contact the semiconductor dies; and the first substrate and the second substrate are coupled to the wiring substrate such that the probe card assembly can be attached to and removed from the test system as a single unit.

5. The method of claim 1, wherein the activating the first deforming mechanism is performed without contacting the tips of the array of contact elements disposed on the surface of the first substrate, and the activating the second deforming mechanism is performed without contacting the tips of the away of contact elements disposed on the surface of the second substrate.

6. The method of claim 1, wherein:
the first deforming mechanism comprises a plurality of first actuators, and
the second deforming mechanism comprises a plurality of second actuators.

7. The method of claim 1, wherein the activating the first deforming mechanism comprises deflecting at least one of a first area of the surface of the first substrate, a second area of the surface of the first substrate, a third area of the surface of the first substrate, and a fourth area of the surface of the first substrate by applying a pulling force to the at least one of the first, second, third, and fourth areas of the surface of the first substrate.

8. The method of claim 7, wherein the activating the second deforming mechanism comprises deflecting at least one of a first area of the surface of the second substrate, a second area of the surface of the second substrate, a third area of the surface of the second substrate, and a fourth area of the surface of the second substrate by applying a pulling force to the at least one of the first, second, third, and fourth areas of the surface of the second substrate.

9. The method of claim 1, wherein the activating the first deforming mechanism comprises:
applying with the first deforming mechanism a pulling force to a first area of the surface of the first substrate; and
applying with the first deforming mechanism a pushing force to at least one other area of the surface of the first substrate different than the first area of the surface of the first substrate.

10. The method of claim 9, wherein the activating the second deforming mechanism comprises:
applying with the second deforming mechanism a pulling force to a first area of the surface of the second substrate; and
applying with the second deforming mechanism a pushing force to at least one other of the surface of the second substrate different than the first area of the surface of the second substrate.

11. The method of claim 10, wherein:
the first deforming mechanism maintains relative positions of the first area and the at least one other area of the surface of the first substrate with respect to each other except while the first deforming mechanism is being activated; and
the second deforming mechanism maintains relative positions of the first area and the at least one other area of the surface of the second substrate with respect to each other except while the second deforming mechanism is being activated.

12. The method of claim 11, wherein:
the first actuator comprises a first screw assembly, and
the activating the first actuator comprises turning a screw of the first screw assembly.

13. The method of claim 12, wherein the first screw assembly maintains the pulling force on the first area of the first substrate.

14. The method of claim 12, wherein the applying with the first deforming mechanism the pushing force comprises activating at least one second of the plurality of actuators each of which is in contact with one of the at least one other areas of the surface of the first substrate.

15. The method of claim 14, wherein:
each of the at least one second actuators comprises a second screw assembly, and
the activating the at least one second actuator comprises turning a screw of the second screw assembly.

16. The method of claim 15, wherein the second screw assembly maintains the pulling force on the at least one other area of the second substrate.

17. The method of claim 15, wherein:
the first substrate comprises a ceramic wiring substrate; and
the second substrate comprises a ceramic wiring substrate.

18. The method of claim 15, wherein the probe card assembly comprises:
a wiring substrate comprising an interface connectable to a tester for controlling testing of semiconductor dies in a test system;
the tips of the contact elements are configured to contact the semiconductor dies; and
the first substrate and the second substrate are coupled to the wiring substrate such that the probe card assembly can be attached to and removed from the test system as a single unit.

19. The method of claim 15, wherein the activating the first deforming mechanism is performed without contacting the tips of the array of contact elements disposed on the surface of the first substrate, and the activating the second deforming mechanism is performed without contacting the tips of the away of contact elements disposed on the surface of the second substrate.

20. The method of claim 9, wherein:
the first deforming mechanism comprises a plurality of actuators, and
the applying with the first deforming mechanism the pulling force comprises activating a first of the plurality of actuators, which is attached to the first area of the surface of the first substrate.

* * * * *